United States Patent
Okada et al.

(10) Patent No.: US 6,815,146 B2
(45) Date of Patent: Nov. 9, 2004

(54) RESIST COMPOSITION

(75) Inventors: Shinji Okada, Yokohama (JP);
Yasuhide Kawaguchi, Yokohama (JP);
Yoko Takebe, Yokohama (JP); Isamu Kaneko, Yokohama (JP); Shun-ichi Kodama, Yokohama (JP)

(73) Assignee: Asahi Glass Company, Limited, Tokyo (JP)

( * ) Notice: Subject to any disclaimer, the term of this patent is extended or adjusted under 35 U.S.C. 154(b) by 0 days.

(21) Appl. No.: 10/376,243

(22) Filed: Mar. 3, 2003

(65) Prior Publication Data
US 2004/0013970 A1 Jan. 22, 2004

(30) Foreign Application Priority Data

Mar. 4, 2002 (JP) ........................................ 2002-057342

(51) Int. Cl.$^7$ ................................................ G03F 7/039
(52) U.S. Cl. ..................... 430/270.1; 430/914; 430/945
(58) Field of Search .............................. 430/270.1, 914, 430/945

(56) References Cited

U.S. PATENT DOCUMENTS

| 6,468,712 B1 | 10/2002 | Fedynyshyn | .............. 430/270.1 |
| 2003/0152864 A1 | 8/2003 | Araki et al. | .............. 430/270.1 |

FOREIGN PATENT DOCUMENTS

| WO | WO 00/17712 | 3/2000 |
| WO | WO 00/67072 | 11/2000 |
| WO | WO 01/63362 | 8/2001 |
| WO | WO 02/064648 | 8/2002 |
| WO | WO 02/065212 | 8/2002 |

OTHER PUBLICATIONS

H. Ito, et al., Proceedings of SPIE, vol. 4345, No. I, XP–002209442, pp. 273–284, "Polymer Design for 157 NM Chemically Amplified Resists", Feb. 26, 2001.
T. H. Fedynyshyn, et al., Proceedings of SPIE, vol. 4345, XP–002251499, pp. 296–307, "High Resolution Fluorocarbon Based Resist for 157–NM Lithography", Feb. 26, 2001.
M. Toriumi, et al., Proceedings of SPIE, vol. 4345, No. 1, XP–002209335, pp. 371–378, "Resist Materials for 157–NM Lithography", Feb. 2001.
S.–I. Kodama, et al., Proceedings of SPIE, vol. 4690, XP–002257635, pp. 76–83, "Synthesis of Novel Fluoropolymer for 157NM Photoresists by Cyclo–Polymerization", Mar. 4–6, 2003.
M. Toriumi, et al., Proceedings of SPIE, vol. 4690, XP–002257636, pp. 191–199, "Fluoropolymer Resists for 157–NM Lithography", Mar. 4–6, 2003.
N. Shida, et al., Proceedings of SPIE, vol. 4690, XP–002257637, pp. 497–503, "157–NM Single Layer Resists Based on Advanced Fluorinated Polymers", Mar. 6, 2003.

*Primary Examiner*—Hoa Van Le
(74) *Attorney, Agent, or Firm*—Oblon, Spivak, McClelland, Maier & Neustadt, P.C.

(57) ABSTRACT

A resist composition containing a fluoropolymer, an acid-generating compound and an organic solvent, a resist film, and methods for making thereof.

30 Claims, No Drawings

RESIST COMPOSITION

The present invention relates to a novel fluorinated resist composition. More particularly, it relates to a chemical amplification type resist composition useful for fine processing employing far ultraviolet rays such as KrF or ArF excimer laser, or vacuum ultraviolet rays such as $F_2$ excimer laser.

In recent years, along with the progress in fine circuit patterns in the process for producing semiconductor integrated circuits, a photoresist material having high resolution and high sensitivity is desired. As the circuit patterns become fine, a short wavelength of a light source for an exposure apparatus becomes essential. In an application to lithography employing an excimer laser of 250 nm or shorter, a polyvinyl phenol type resin, an alicyclic acrylic type resin, a polynorbornene type resin or a fluororesin has, for example, been proposed, but no adequate resolution and sensitivity have been obtained.

It is an object of the present invention to provide a resist composition which is particularly excellent in transparency to far ultraviolet rays such as KrF or ArF excimer laser or vacuum ultraviolet rays such as $F_2$ excimer laser and dry etching properties, as a chemical amplification type resist and which gives a resist pattern excellent in sensitivity, resolution, evenness, heat resistance, etc.

The present invention is the following invention which has been made to solve the above-described problems.

A resist composition comprising the following fluoropolymer (A), an acid-generating compound (B) which generates an acid under irradiation with light and an organic solvent (C):

Fluoropolymer (A): a fluoropolymer having blocked acidic groups, which is a fluoropolymer having monomeric units formed by cyclopolymerization of a fluorinated diene of the formula (1) and monomeric units formed by polymerization of an acrylic monomer of the formula (2) and which is, when a copolymer obtained by polymerizing the fluorinated diene of the formula (1) and the acrylic monomer of the formula (2), has no blocked acidic groups, obtained by forming blocked acidic groups in the copolymer:

$$CF_2=CR^1-Q-CR^2=CH_2 \quad (1)$$

wherein each of $R^1$ and $R^2$ which are independent of each other, is a hydrogen atom, a fluorine atom, a methyl group or a trifluoromethyl group, and Q is a bivalent organic group which is a blocked acidic group capable of forming an acidic group by an acid, an acidic group, or a group which can be converted to a blocked acidic group and which is other than an acidic group;

$$CH_2=CR^3-CO_2R^4 \quad (2)$$

wherein $R^3$ is a hydrogen atom, a fluorine atom, a methyl group or a trifluoromethyl group, and $R^4$ is a hydrogen atom, a hydrocarbon group, an organic group having an acidic group, an organic group having a blocked acidic group capable of forming an acidic group by an acid, or an organic group having a group which can be converted to a blocked acidic group and which is other than an acidic group.

It is considered that by the copolymerization of the fluorinated diene of the formula (1) (hereinafter referred to also as the fluorinated diene (1)) with the acrylic monomer of the formula (2) (hereinafter referred to also as the acrylic monomer (2)), a cyclized copolymer having the following monomeric units (a) to (c) derived from the fluorinated diene (1) will be formed. From the results of the spectroscopic analyses, etc., this cyclized copolymer is considered to be a polymer having a structure comprising monomeric units (a), monomeric units (b) or both of them, as the main monomeric units. Here, the main chain of this cyclized copolymer is meant for a carbon chain composed of carbon atoms constituting polymerizable unsaturated bonds (in the case of the fluorinated diene (1), four carbon atoms constituting the polymerizable unsaturated double bonds).

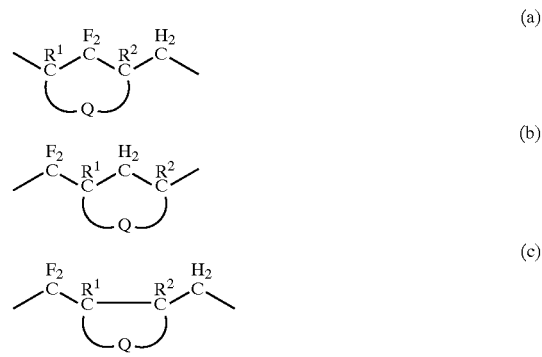

The fluoropolymer (A) in the present invention has blocked acidic groups capable of forming acidic groups by an acid (hereinafter referred to simply as blocked acidic groups). In a case where the fluorinated diene (1) and/or the acrylic monomer (2) has a blocked acidic group, the fluoropolymer (A) can be obtained by their copolymerization. In a case where the fluorinated diene (1) and the acrylic monomer (2) have no blocked acidic groups, the fluoropolymer (A) can be obtained by converting acidic groups or groups which can be converted to blocked acidic groups and which are other than acidic groups (hereinafter referred also as the precursor groups), present in the copolymer of the fluorinated diene (1) with the acrylic monomer (2), to blocked acidic groups. The acidic groups can be converted to the blocked acidic groups by reacting them with a blocking agent. The precursor groups may, for example, be blocked acidic groups other than the desired blocked acidic groups (such as those which can not easily be deblocked by an acid generated from the acid-generating compound (B)). They may be converted to the desired blocked acidic groups by converting the blocked portions directly or via acidic groups.

It is preferred that the fluoropolymer (A) in the present invention further has acidic groups, whereby the solubility of the resist material can be controlled. The blocked ratio of the fluoropolymer (A) (i.e. the ratio of blocked acidic groups to the total of the blocked acidic groups and non-blocked acidic groups) is preferably from 10 to 99 mol %, particularly preferably from 10 to 90 mol %.

In the formula (1), each of $R^1$ and $R^2$ which are independent of each other, is a hydrogen atom, a fluorine atom, a methyl group or a trifluoromethyl group. $R^1$ is preferably a fluorine atom or a trifluoromethyl group. $R^2$ is preferably a hydrogen atom or a methyl group. Q is a bivalent organic group which is an organic group having a blocked acidic group, an acidic group or the precursor group.

In Q, the minimum distance between connecting bonds at its both terminals corresponds preferably to from 2 to 6 atoms, particularly preferably 2 to 4 atoms, as represented by the number of atoms (the atomic chain constituting this minimum distance will be hereinafter referred to as the main chain). The atoms constituting the main chain may be composed of carbon atoms only, or carbon atoms and other bivalent or higher valent atoms. The bivalent or higher valent atoms other than carbon atoms, may, for example, an oxygen atom, a sulfur atom and a nitrogen atom substituted by a monovalent group. An oxygen atom is particularly preferred. Such an oxygen atom or the like may be present at either one or both of the two terminals, or may be present between carbon atoms in Q.

In the main chain in Q, at least one carbon atom is present, and to a carbon atom constituting the main chain in Q, a blocked acidic group, an acidic group, a precursor group or an organic group containing a blocked acidic group, an acidic group or a precursor group, is bonded. In addition to such a specific group, hydrogen atoms or halogen atoms (particularly preferably fluorine atoms) are bonded to carbon atoms, etc. constituting the main chain, and further, an alkyl group, a fluoroalkyl group, an alkoxy group, an aryl group or other organic groups may be bonded thereto. The carbon number of such an organic group is preferably at most 6.

The acidic group may, for example, be an acidic hydroxyl group, a carboxylic group or a sulfonic group, particularly preferably an acidic hydroxyl group and a carboxylic group, most preferably an acidic hydroxyl group. The acidic hydroxyl group is a hydroxyl group showing acidity, and it may, for example, be a hydroxyl group bonded directly to the ring of an aryl group (a phenolic hydroxyl group), a hydroxyl group bonded to a carbon atom having a perfluoroalkyl group (preferably a $C_{1-2}$ perfluoroalkyl group) bonded thereto, or a hydroxyl group bonded to a tertiary carbon atom. Particularly preferred is a hydroxyl group bonded to a carbon atom having one or two perfluoroalkyl groups bonded thereto. In a case where the perfluoroalkyl group is a trifluoromethyl group, for example, a hydroxyl group in a bivalent group of the following formula (d-1) (i.e. a hydroxyl group in a hydroxytrifluoromethylmethylene group) or a hydroxyl group in a monovalent group of the following formula (d-2) or (d-3) (i.e. a hydroxyl group in a 1-hydroxy-1-trifluoromethyl-2,2,2-trifluoroethyl group or a 1-hydroxy-1-methyl-2,2,2-trifluoroethyl group) is preferred.

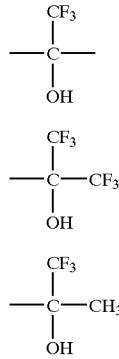

(d-1)

(d-2)

(d-3)

The blocked acidic group can be obtained by reacting a blocking agent to the acidic group as described above. Otherwise, in a molecule having an acidic group, a moiety capable of blocking such an acidic group, may be present, so that a blocked acidic group may be formed by the reaction of such a moiety with the acidic group. In such a case, the blocked acidic group will be cyclic. The blocked acidic group is a group which can be converted to an acidic group by an acid which is generated by the acid-generating compound (B) which generates an acid under irradiation with light, in the resist composition. In a case where the acidic group is a carboxylic group or a sulfonic group, a blocking agent such as an alkanol may be reacted to substitute an alkyl group or the like for the hydrogen atom in the acidic group to form a blocked acidic group.

In a case where the acidic group is an acidic hydroxyl group, the blocked acidic group is preferably a blocked acidic group obtainable by substituting an alkyl group, an alkoxycarbonyl group, an acyl group, a cyclic ether group or the like for the hydrogen atom in the acidic hydroxyl group. A preferred alkyl group to be substituted for the hydrogen atom in the hydroxyl group, may be a $C_{1-6}$ alkyl group which may have a substituent (such as an aryl group or an alkoxy group). Specific examples of such an alkyl group include an alkyl group having at most 6 carbon atoms (such as a tert-butyl group (t-$C_4H_9$)), an aryl group-substituted alkyl group having a total carbon number of from 7 to 20 (such as a benzyl group, a triphenylmethyl group, a p-methoxybenzyl group or a 3,4-dimethoxybenzyl group), and an alkoxyalkyl group having a total carbon number of at most 8 (such as a methoxymethyl group, a (2-methoxyethoxy)methyl group or a benzyloxymethyl group). A preferred alkoxycarbonyl group to be substituted for the hydrogen atom of the hydroxyl group, may, for example, be an alkoxycarbonyl group having a total carbon number of at most 8 or a tert-butoxycarbonyl group (—COO(tert-$C_4H_9$)). A preferred acyl group to be substituted for the hydrogen atom of the hydroxyl group, may be an acyl group having a total carbon number of at most 8, and it may, for example, be a pivaloyl group, a benzoyl group or an acetyl group. A preferred cyclic ether group to be substituted for the hydrogen atom of the hydroxyl group, may, for example, be a tetrahydropyranyl group (THP).

To block the acidic hydroxyl group, an alcohol, a carboxylic acid or an active derivative thereof is, for example, reacted. The active derivative thereof may, for example, be an alkyl halide, an acid chloride, an acid anhydride, a chlorocarbonic acid ester, a dialkyl dicarbonate (such as di-tert-butyl dicarbonate) or 3,4-dihydro-2H-pyran. Specific examples of the reagent useful for blocking a hydroxyl group are disclosed in Handbook of Reagents for Organic Synthesis: Activating Agents and Protecting Groups, compiled by A. J. Pearson and W. R. Roush, published by John Wiley & Sons (1999).

As the acidic group, an acidic hydroxyl group is particularly preferred, and as the blocked acidic group, a blocked acidic hydroxyl group is preferred. Specifically, as the blocked acidic hydroxyl group, O(tert-$C_4H_9$), $OCH_2OCH_3$, $OCO_2$(tert-$C_4H_9$), $OCH(CH_3)OC_2H_5$ or a 2-tetrahydropyranyloxy group is preferred.

Q is preferably a bivalent organic group of the following formula (3). Accordingly, the fluorinated diene (1) is preferably a compound of the following formula (9) (wherein $R^1$ and $R^2$ are as defined above).

$$—R^5—C(R^7)(R^8)—R^6— \qquad (3)$$

$$CF_2=CR^1—R^5—C(R^7)(R^8)—R^6—CR^2=CH_2 \qquad (9)$$

wherein each of $R^5$ and $R^6$ which are independent of each other, is a single bond, an oxygen atom, an alkylene group having at most 3 carbon atoms, which may have an etheric oxygen atom, or a fluoroalkylene group having at most 3 carbon atoms, which may have an etheric oxygen atom, $R^7$ is a hydrogen atom, a fluorine atom, an alkyl group having at most 3 carbon atoms, or a fluoroalkyl group having at most 3 carbon atoms, and $R^8$ is a blocked acidic group, an acidic group, or a monovalent organic group having a blocked acidic group or an acidic group.

The alkylene group for $R^5$ or $R^6$ is preferably $(CH_2)_n$, and the fluoroalkylene group is preferably $(CF_2)_m$ (each of m and n is an integer of from 1 to 3). In the combination of $R^5$ and $R^6$, it is preferred that both are alkylene groups or fluoroalkylene groups (in such a case, m+n is preferably 2 or 3), or one of them is an alkylene group or a fluoroalkylene group, and the other is a single bond or an oxygen atom. The alkyl group for $R^7$ is preferably a methyl group, and the fluoroalkyl group for $R^7$ is preferably a trifluoromethyl group.

$R^8$ in the case of a monovalent organic group, is preferably an organic group having at most 8 carbon atoms, and the moiety excluding the blocked acidic group or the acidic group, is preferably a hydrocarbon group or a fluorohydrocarbon group. Particularly preferred is a $C_{2-6}$ alkyl group, a $C_{2-6}$ fluoroalkyl group or a $C_{7-9}$ phenylalkyl group, which has a blocked acidic group or an acid group (provided that in the phenylalkyl group, the blocked acidic group or the like is bonded to the phenyl group). Specifically, the following groups may be mentioned as $R^8$ (wherein k is an integer of from 1 to 6, and X is a blocked acidic group or an acidic group).

—(CH$_2$)$_k$—X, —(CH$_2$)$_k$C(CF$_3$)$_2$—X, —(CH$_2$)$_k$C(CH$_3$)$_2$—X,

—(CH$_2$)$_k$C(CF$_3$)(CH$_3$)—X, —(CH$_2$)$_k$CH(CH$_3$)—X, and
—(CH$_2$)$_k$C$_6$H$_4$—X.

Compounds of the following chemical formulae may be mentioned as preferred examples of the fluorinated diene (1).

CF$_2$=CF(CF$_2$)$_a$C(Y)(CF$_3$)(CH$_2$)$_b$CH=CH$_2$,

CF$_2$=CF(CF$_2$)$_a$C(Y)(CF$_3$)(CF$_2$)$_b$CH=CH$_2$,

CF$_2$=CF(CH$_2$)$_a$C(Y)(CF$_3$)(CH$_2$)$_b$CH=CH$_2$,

CF$_2$=CF(CH$_2$)$_a$C(Y)(CF$_3$)(CF$_2$)$_b$CH=CH$_2$,

CF$_2$=CF(CF$_2$)$_a$C(Y)(CF$_3$)(CF$_2$)$_b$C(CH$_3$)=CH$_2$,

CF$_2$=C(CF$_3$)(CF$_2$)$_a$C(Y)(CF$_3$)(CF$_2$)$_b$CH=CH$_2$, and

CF$_2$=CF(CF$_2$)$_a$CH(Z)(CH$_2$)$_b$CH=CH$_2$.

In the above formulae, Y is $X^1$ or $R^{10}X^1$, Z is $R^{10}X^1$, wherein $X^1$ is OH, O(tert-C$_4$H$_9$), OCH$_2$OCH$_3$, OCO$_2$(tert-C$_4$H$_9$), OCH(CH$_3$)OC$_2$H$_5$ or a 2-tetrahydropyranyloxy group, and $R^{10}$ is (CH$_2$)$_p$C(CF$_3$)$_2$, (CH$_2$)$_p$C(CF$_3$)(CH$_3$) or (CH$_2$)$_p$C$_6$H$_4$. Further, each of a and b which are independent of each other, is an integer of from 0 to 3 (provided that a+b is from 1 to 3), and p is an integer of from 1 to 3. The most preferred $X^1$ is O(tert-C$_4$H$_9$), OCH$_2$OCH$_3$, OCO$_2$(tert-C$_4$H$_9$), OCH(CH$_3$)OC$_2$H$_5$ or a 2-tetrahydropyranyloxy group, and the most preferred $R^{10}$ is (CH$_2$)$_p$C(CF$_3$)$_2$. Each of a and b is most preferably 1.

The most preferred fluorinated diene (1) is a compound of the following formula (4) or (5).

CF$_2$=CFCF$_2$CX$^2$(CF$_3$)CH$_2$CH=CH$_2$ (4)

CF$_2$=CFCF$_2$CH(—(CH$_2$)$_p$C(CF$_3$)$_2$X$^2$)CH$_2$CH=CH$_2$ (5)

wherein $X^2$ is a hydroxyl group, O(tert-C$_4$H$_9$), OCH$_2$OCH$_3$, OCO$_2$(tert-C$_4$H$_9$), OCH(CH$_3$)OC$_2$H$_5$ or a 2-tetrahydropyranyloxy group, and p is an integer of from 1 to 3.

The acrylic monomer (2) in the present invention is represented by the formula (2) wherein $R^3$ is a hydrogen atom, a fluorine atom, a methyl group or a trifluoromethyl group. Further, like the fluorinated diene (1), the acrylic monomer (2) has a blocked acidic group, an acidic group or a precursor group. In a case where $R^4$ is a hydrogen atom, —CO$_2R^4$ is one type of an acidic group, and in a case where $R^4$ is a hydrocarbon group, —CO$_2R^4$ is one type of a blocked acidic group, or one type of a precursor group.

In a case where $R^4$ is an organic group having an acidic group, such an acidic group may, for example, be an acidic hydroxyl group, a carboxylic group (i.e. —CO$_2$H) or a sulfonic group, preferably an acidic hydroxyl group or a carboxylic group, most preferably an acidic hydroxyl group. The acidic hydroxyl group is preferably the same acidic hydroxyl group as the one in the above-described fluorinated diene (1), particularly preferably a hydroxyl group bonded to a carbon atom having one or two perfluoroalkyl groups bonded thereto, especially preferably a hydroxyl group in the monovalent group represented by the above formula (b-2).

In a case where $R^4$ is a hydrocarbon group, such a hydrocarbon group may, for example, be an aliphatic hydrocarbon group, an alicyclic hydrocarbon group or an aromatic hydrocarbon group, and the carbon number thereof is preferably at most 20, particularly preferably at most 8. In a case where —CO$_2R^4$ wherein $R^4$ is a hydrocarbon group, is used as a blocked acidic group, it is preferably one which can easily form an acidic group by an acid. $R^4$ in such a case, is preferably an alkyl group, and its carbon number is preferably from 2 to 8. As an alkyl group which can easily be removed, a secondary alkyl group or a tertiary alkyl group is preferred. The most preferred hydrocarbon group is a $C_{4-7}$ tertiary alkyl group such as tert-C$_4$H$_9$, or a cyclic tertiary alkyl group of the following formula (e-1) or (e-2). Here, in the formula (e-1) or (e-2), $R^{16}$ is a $C_{1-4}$ alkyl group, particularly preferably a methyl group.

In a case where $R^4$ is a hydrogen atom or a hydrocarbon group, the most preferred acrylic monomer is represented by the following formula (6), wherein $R^3$ is as defined above, and $R_9$ is a hydrogen atom or a tert-butyl group.

CH$_2$=CR$^3$CO$_2$R$^9$ (6)

In a case where $R^4$ is an organic group having a blocked acidic group, the acidic group before being blocked may be an acidic group as described above, particularly preferably an acidic hydroxyl group. The blocked acidic group is preferably the same blocked acidic group as the one in the above-described fluorinated diene (1), particularly preferably the same blocked acidic hydroxyl group as the one in the above-described fluorinated diene (1). Specifically, it is preferably a blocked acidic hydroxyl group, wherein the hydrogen atom in a hydroxyl group in e.g. —C(CF$_3$)$_2$—OH, is substituted by a tert-butyl group, —CH$_2$OCH$_3$, —COO (tert-C$_4$H$_9$), —CH(CH$_3$)OC$_2$H$_5$ or a 2-tetrahydropyranyl group.

In a case where $R^4$ is an organic group having a precursor group, such a precursor group is preferably the same precursor group as the one in the above-described fluorinated diene (1). As the precursor group, there may be a blocked acidic group which can not easily be deblocked by an acid generated from the above-described acid-generating compound (B). By changing the blocking agent, it may be converted to a blocked acidic group which can easily be deblocked by an acid generated from the acid-generating compound (B).

The organic group having a blocked acidic group, an acidic group or a precursor group, is a monovalent organic group, wherein the moiety excluding the blocked acidic group, the acidic group or the precursor group, is a bivalent organic group (in a case where the organic group has one blocked acidic group or the like), which is preferably a hydrocarbon group, a halogenated hydrocarbon group (particularly a fluorinated hydrocarbon group) or a hydrocarbon group or a halogenated hydrocarbon group (particularly a fluorinated hydrocarbon group) having an oxygen atom, a sulfur atom or a nitrogen atom substituted by a monovalent group, between carbon atoms. The hydrocarbon group is preferably an aliphatic hydrocarbon group (such as an alkylene group), an alicyclic hydrocarbon group (such as a cycloalkylene group), an aromatic hydrocarbon group (such as a phenylene group) or an aliphatic hydrocarbon group having an alicyclic hydrocarbon group or an aromatic hydrocarbon group at its terminal, between carbon atoms or in a side chain. The halogenated hydrocarbon group is preferably a halogenated hydrocarbon group having some of hydrogen atoms of such a hydrocarbon group substituted by fluorine atoms.

A monovalent organic group of the following formula (10) is preferred as the organic group having a blocked acidic group, an acidic group or a precursor group.

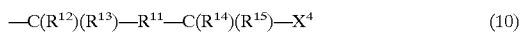    (10)

wherein $R^{11}$ is an alkylene group having at most 6 carbon atoms, a cyclohexylene group or a phenylene group, each of $R^{12}$ to $R^{15}$ which are independent of one another, is a hydrogen atom, an alkyl group having at most 4 carbon atoms, or a halogenated alkyl group having at most 4 carbon atoms, and $X^4$ is a blocked acidic group, an acidic group or a precursor group. At least one of $R^{12}$ and $R^{13}$, and at least one $R^{14}$ and $R^{15}$, is preferably a $C_1$ or $C_2$ perfluoroalkyl group.

A particularly preferred organic group of the formula (10) is an organic group having an acidic hydroxyl group of the following formula (e-3) or (e-4), or such an organic group having a blocked acidic hydroxyl group, wherein such an acidic hydroxyl group is blocked.

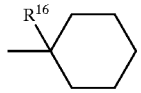 (e-1)

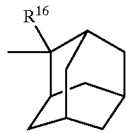 (e-2)

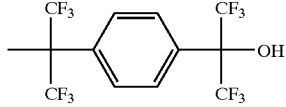 (e-3)

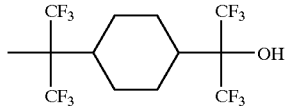 (e-4)

The acrylic monomer (2) wherein $R^4$ is an organic group having a blocked acidic group, an acidic group or a precursor group, can be obtained by bonding a monool having a blocked acidic group, an acidic group or a precursor group and $CH_2=CR^3COOH$ by esterification. In a case where the acidic group is an acidic hydroxyl group, this monool is preferably a polyol having at least two acidic hydroxyl groups (particularly a diol). By bonding one molecule of such a polyol and one molecule of such a monool by esterification, an acrylic monomer (2) will be obtained.

A compound of the following formula (7) or (8) is preferred as the acrylic monomer (2) wherein $R^4$ is an organic group having a blocked acidic group, an acidic group or a precursor group.

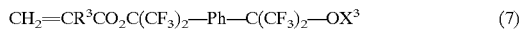    (7)

    (8)

wherein $R^3$ is as defined above, $X^3$ is a hydrogen atom, a tert-butyl group, —$CH_2OCH_3$, —$CO_2$(tert-$C_4H_9$), —CH($CH_3$)$OC_2H_5$ or a 2-tetrahydropyranyl group, Ph is a phenylene group, and $R^y$ is a cyclohexylene group.

Further, the fluoropolymer (A) may contain monomeric units derived from other radical polymerizable monomers (hereinafter referred to as other monomers) within a range not to impair its characteristics. The proportion of the monomeric units derived from such other monomers is preferably at most 30 mol %, particularly preferably at most 15 mol %, based on the total monomeric units.

Such other monomers may, for example, be α-olefins such as ethylene, propylene and isobutylene, fluorinated olefins such as tetrafluoroethylene, hexafluoropropylene and perfluoropropyl vinyl ether, fluorinated cyclic monomers such as perfluoro(2,2-dimethyl-1,3-dioxole, cyclopolymerizable perfluorodienes such as perfluoro(butenyl vinyl ether), vinyl esters such as vinyl acetate, vinyl pivalate, vinyl benzoate and vinyl adamantylate, vinyl ethers such as ethyl vinyl ether and cyclohexyl vinyl ether, cyclic olefins such as cyclohexene, norbornene and norbornadiene, crotonic acid esters such as methyl crotonate, cinnamic acid esters such as methyl cinnamate and monomers derived from maleic anhydride, vinyl chloride, styrene, etc.

A fluoropolymer is obtained by polymerizing the fluorinated diene (1) and the acrylic monomer (2), and if necessary, other monomers. In a case where neither the fluorinated diene (1) nor the acrylic monomer (2) has a blocked acidic group, some or all of acidic groups or precursor groups in the resulting fluoropolymer are converted to blocked acidic groups to form blocked acidic groups in the fluoropolymer, thereby to obtain the fluoropolymer (A) having blocked acidic groups. In a case where at least one of the fluorinated diene (1) and the acrylic monomer (2) has a blocked acidic group, a fluoropolymer (A) having blocked acidic groups can be obtained by the polymerization. In a case where such a fluoropolymer (A) further has acidic groups or precursor groups, some or all of such acidic groups or precursor groups may be converted to blocked acidic groups, as the case requires.

Further, the fluoropolymer (A) may have acidic groups or precursor groups in addition to the blocked acidic groups, and particularly preferably, it has acidic groups. When it has non-blocked acidic groups, the solubility in the developer can be controlled, and the resolution can be improved.

The fluoropolymer (A) having blocked acidic groups and acidic groups, can be obtained by copolymerizing a fluorinated diene (1) or an acrylic monomer (2) having a blocked acidic group with a fluorinated diene (1) or an acrylic monomer (2) having an acidic group. For example, it can be obtained by copolymerizing a fluorinated diene (1) having an acidic group with an acrylic monomer (2) having a blocked acidic group, by copolymerizing a fluorinated diene (1) having a blocked acidic group with an acrylic monomer (2) having an acidic group, or by copolymerizing a fluorinated diene (1) having a blocked acidic group, a fluorinated diene (1) having an acidic group and an acrylic monomer (2) having a blocked acidic group. Further, for example, after copolymerizing the fluorinated diene (1) having an acidic group with an acrylic monomer (2) having an acidic group, some of acidic groups in the copolymer may be converted to blocked acidic groups, to produce a fluoropolymer (A) having blocked acidic groups and acidic groups.

In the fluoropolymer (A), the proportion of the monomeric units having blocked acidic groups, based on the total monomeric units of the fluoropolymer (A) is preferably from 10 to 100 mol %, particularly preferably from 10 to 90 mol %. In a case where the fluoropolymer (A) has blocked acidic groups and acidic groups, the proportion of the monomeric units having blocked acidic groups based on the total monomeric units of the fluoropolymer (A) is preferably from 10 to 99 mol %, particularly preferably from 10 to 90 mol %, and the proportion of the monomeric units having acidic groups is preferably from 1 to 90 mol %, particularly preferably from 10 to 90 mol %, and the total of both proportions is preferably from 30 to 100 mol %.

In the fluoropolymer (A), the compositional ratio of the monomeric units formed by cyclopolymerization of the fluorinated diene (1) (hereinafter referred to as units (1)) to the monomeric units formed by polymerization of the acrylic monomer (2) (hereinafter referred to as units (2)) (i.e. units (1):units (2)), is preferably from 95 to 5 to 50:50 by molar ratio. As units (1) are at most 95 mol % based on the total of both units, the developability will be improved, and as they are at least 50 mol %, the fluoropolymer (A) will be a polymer having a high permeability of ultraviolet rays having a particularly short wavelength (i.e. excimer laser rays having a wavelength of at most 250 nm), whereby a sufficient resolution can be obtained.

The molecular weight of the fluoropolymer (A) in the present invention is not particularly limited so long as it can be uniformly dissolved in an organic solvent which will be described hereinafter and it can be uniformly coated on a substrate. However, usually, its number average molecular weight as calculated as polystyrene is suitably from 1,000 to 100,000, preferably from 2,000 to 20,000. By adjusting the number average molecular weight to be at least 1,000, a better resist pattern can be obtained, and the film-remaining ratio after the development will be sufficient, and the dimensional stability during the heat treatment of the pattern will be better. Further, by adjusting the number average molecular weight to be at most 100,000, the coating property of the composition will be better, and the sufficient developability can be maintained.

By copolymerizing the fluorinated diene (1), the acrylic monomer (2) and, if necessary, other monomers, in the presence of a polymerization initiator, the fluoropolymer (A) can be obtained. The polymerization initiator is not particularly limited, so long as it lets the polymerization reaction proceed radically. For example, it may be a radical-generating agent, light or ionizing radiation. Particularly preferred is a radical-generating agent, and a peroxide, an azo compound or a persulfate may, for example, be mentioned.

The polymerization method is also not particularly limited, and so-called bulk polymerization in which monomers are subjected to polymerization as they are, solution polymerization which is carried out in a fluorohydrocarbon, a chlorohydrocarbon, a fluorinated chlorohydrocarbon, an alcohol, a hydrocarbon or other organic solvent, capable of dissolving the monomers, suspension polymerization which is carried out in an aqueous medium in the absence or presence of a suitable organic solvent, or emulsion polymerization which is carried out by adding an emulsifier to an aqueous medium, may, for example, be mentioned.

In the present invention, the acid-generating compound (B) which generates an acid under irradiation with light, will generate an acid upon exposure. By this acid, the blocked acidic groups present in the fluoropolymer (A) will be cleaved (deblocked). As a result, the exposed portions of the resist film will be readily soluble by an alkaline developer, and a positive resist pattern will be formed by an alkaline developer. As such an acid-generating compound (B) which generates acid under irradiation with light, it is possible to employ an acid-generating compound which is commonly used for a chemical amplification type resist material. Namely, an onium salt, a halogenated compound, a diazoketone compound, a sulfone compound or a sulfonic compound, may, for example, be mentioned. The following may be mentioned as examples of such an acid-generating compound (B).

The onium salt may, for example, be an iodonium salt, a sulfonium salt, a phosphonium salt, a diazonium salt or a pyridinium salt. Specific examples of a preferred onium salt include diphenyliodonium triflate, diphenyliodonium pyrenesulfonate, diphenyliodonium dodecylbenzenesulfonate, bis(4-tert-butylphenyl)iodonium triflate, bis(4-tert-butylphenyl)iodonium dodecylbenzenesulfonate, triphenylsulfonium triflate, triphenylsulfonium hexafluoroantimonate, 1-(naphthylacetomethyl)thioranium triflate, cyclohexylmethyl(2-oxocyclohexyl)sulfonium triflate, dicyclohexyl(2-oxocyclohexyl)sulfonium triflate, dimethyl (4-hydroxynaphthyl)sulfonium tosylate, dimethyl(4-hydroxynaphthyl)sulfonium dodecylbenzenesulfonate, dimethyl(4-hydroxynaphthyl)sulfoniumnaphthalene sulfonate, triphenylsulfonium camphorsulfonate and (4-hydroxyphenyl)benzylmethylsulfonium toluenesulfonate.

The halogenated compound may, for example, be a haloalkyl group-containing hydrocarbon compound or a haloalkyl group-containing heterocyclic compound. Specifically, it may, for example, be a (trichloromethyl)-s-triazine derivative such as phenyl-bis(trichloromethyl)-s-triazine, methoxyphenyl-bis(trichloromethyl)-s-triazine or naphthyl-bis(trichloromethyl)-s-triazine, or 1,1-bis(4-chlorophenyl)-2,2,2-trichloroethane.

The sulfone compound may, for example, be β-ketosulfone, β-sulfonylsulfone or an α-diazo compound of such a compound. Specifically, it may, for example, be 4-trisphenacylsulfone, methylphenacylsulfone or bis (phenylsulfonyl)methane. The sulfonic compound may, for example, be an alkylsulfonic acid ester, an alkylsulfonic acid imide, a haloalkylsulfonic acid ester, an arylsulfonic acid ester or an iminosulfonate. Specifically, it may, for example, be benzoin tosylate or 1,8-naphthalene dicarboxylic acid imide triflate. In the present invention, such acid-generating compounds (B) may be used alone or in combination as a mixture of two or more of them.

In the present invention, the organic solvent (C) is not particularly limited so long as it is capable of dissolving both components (A) and (B). It may, for example, be an alcohol such as methyl alcohol or ethyl alcohol, a ketone such as acetone, methyl isobutyl ketone or cyclohexanone, an acetate such as ethyl acetate or butyl acetate, an aromatic hydrocarbon such as toluene or xylene, a glycol monoalkyl ether such as propylene glycol monomethyl ether or propylene glycol monoethyl ether, or a glycol monoalkyl ether ester such as propylene glycol monomethyl ether acetate or carbitol acetate.

The proportions of the respective components in the resist composition of the present invention are usually such that per 100 parts by mass of the fluoropolymer (A), the acid-generating compound (B) is from 0.1 to 20 parts by mass, and the organic solvent (C) is from 50 to 2,000 parts by mass. Preferably, per 100 parts by mass of the fluoropolymer (A), the acid-generating compound (B) is from 0.1 to 10 parts by mass, and the organic solvent (C) is from 100 to 1,000 parts by mass.

By adjusting the amount of the acid-generating compound (B) to be at least 0.1 part by mass, it is possible to provide a sufficient sensitivity and developability, and by adjusting it to be at most 10 parts by mass, the transparency to radiation can be sufficiently maintained, whereby an accurate resist pattern can be obtained.

To the resist composition of the present invention, an acid-cleavable additive to improve the pattern contrast, a surfactant to improve the coating property, a nitrogen-containing basic compound to adjust the acid-generating pattern, an adhesion-assisting agent to improve the adhesion to the substrate or a storage stabilizer to increase the storage stability of the composition, may, for example, be optionally incorporated. Further, the resist composition of the present invention is preferably employed in such a manner that the respective components are uniformly mixed, followed by filtration by means of a filter of from 0.1 to 2 $\mu$m.

The resist composition of the present invention is coated on a substrate such as a silicone wafer, followed by drying to form a resist film. As the coating method, spin coating, cast coating or roll coating may, for example, be employed. The formed resist film will be irradiated with light via a mask having a pattern drawn thereon, followed by development treatment to form the pattern.

The light beams for the irradiation may, for example, be ultraviolet rays such as g-line having a wavelength of 436 nm or i-line having a wavelength of 365 nm, or far ultraviolet rays or vacuum ultraviolet rays, such as KrF excimer laser having a wavelength of 248 mm, ArF excimer laser having a wavelength of 193 nm or $F_2$ excimer laser having a wavelength of 157 nm. The resist composition of the present invention is a resist composition useful particularly for an application where ultraviolet rays having a wavelength of at most 250 nm, especially ultraviolet rays having a wavelength of at most 200 nm (such as ArF laser or $F_2$ laser), are used as the light source.

As the development treatment solution, various alkali aqueous solutions are employed. As such alkali, sodium hydroxide, potassium hydroxide, ammonium hydroxide, tetramethyl ammonium hydroxide or triethylamine may, for example, be mentioned.

EXAMPLES

Now, the present invention will be described in further detail with reference to Examples. However, it should be understood that the present invention is by no means restricted by such specific Examples. Here, THF represents tetrahydrofuran, and PTFE represents polytetrafluoroethylene.

Preparation Examples for the Fluorinated Diene (1)

Preparation Example 1

Into a 2 L reactor made of glass, 108 g of $CF_2ClCFClCF_2C(O)CF_3$ and 500 ml of dehydrated THF were charged and cooled to 0° C. A diluted solution having 200 ml of a 2M THF solution of $CH_2$=$CHCH_2MgCl$ further diluted with 200 ml of dehydrated THF, was dropwise added thereto in a nitrogen atmosphere over a period of about 5.5 hours. After completion of the dropwise addition, the mixture was stirred at 0° C. for 30 minutes and at room temperature for 17 hours, whereupon 200 ml of 2N hydrochloric acid was dropwise added. 200 ml of water and 300 ml of diethyl ether were added for liquid separation, and a diethyl ether layer was obtained as an organic layer. The organic layer was dried over magnesium sulfate, followed by filtration to obtain a crude liquid. The crude liquid was concentrated by an evaporator, followed by distillation under reduced pressure to obtain 85 g of $CF_2ClCFClCF_2C(CF_3)(OH)CH_2CH$=$CH_2$ (60 to 66° C./0.7 kPa).

Then, into a 500 ml reactor made of glass, 81 g of zinc and 170 ml of dioxane were charged, and activation of zinc was carried out by iodine. The reactor was heated to 100° C., and a solution prepared by diluting 84 g of $CF_2ClCFClCF_2C(CF_3)(OH)CH_2CH$=$CH_2$ synthesized as described above, with 50 ml of dioxane, was dropwise added thereto over a period of 1.5 hours. After completion of the dropwise addition, the mixture was stirred at 100° C. for 40 hours. The reaction solution was filtered and washed with a small amount of dioxane. The filtrate was distilled under reduced pressure to obtain 30 g of $CF_2$=$CFCF_2C(CF_3)(OH)CH_2CH$=$CH_2$ (36 to 37° C./1 kPa). The $^1H$ NMR and $^{19}F$ NMR data are shown below.

$^1H$ NMR (399.8 MHz, solvent: $CDCl_3$, standard: tetramethylsilane) $\delta$ (ppm): 2.74 (d, J=7.3, 2H) 3.54 (broad s, 1H), 5.34 (m, 2H), 5.86 (m, 1H).

$^{19}F$ NMR (376.2 MHz, solvent: $CDCl_3$, standard: $CFCl_3$) $\delta$ (ppm): −75.7 (m, 3F), −92.2 (m, 1F), −106.57 (m, 1F) −112.6 (m, 2F), −183.5 (m, 1F).

Preparation Example 2

Into a 10 L reactor made of glass, 758 g of $CF_2ClCFClCF_2C(O)CF_3$ and 4.5 L of dehydrated THF were charged and cooled to 0° C. 1.4 L of a 2M THF solution of $CH_2$=$CHCH_2MgCl$, was dropwise added thereto in a nitrogen atmosphere over a period of about 10.5 hours. After completion of the dropwise addition, the mixture was stirred at 0° C. for 30 minutes and at room temperature for 12 hours, whereupon 350 g of chloromethyl methyl ether was dropwise added. The mixture was further stirred at room temperature for 92 hours. 1.5 L of water was added, followed by liquid separation. The organic layer was concentrated by an evaporator, and the crude liquid was washed twice with water of 1.5 L. Then, it was distilled under reduced pressure to obtain 677 g of $CF_2ClCFClCF_2C(CF_3)(OCH_2OCH_3)CH_2CH$=$CH_2$ (53 to 55° C./0.17 kPa).

Then, into a 3 L reactor made of glass, 577 g of zinc and 1.3 L of dioxane were charged, and activation of zinc was carried out by iodine. Then, the reactor was heated to 100° C., and 677 g of $CF_2ClCFClCF_2C(CF_3)(OCH_2OCH_3)CH_2CH$=$CH_2$ synthesized as described above, was dropwise added thereto over a period of 2 hours. After completion of the dropwise addition, the mixture was stirred at 100° C. for 47 hours. The reaction solution was filtered and washed with a small amount of dioxane. To the filtrate, 2.5 L of water and 1.5 L of diethyl ether were added, followed by liquid separation. The organic layer was dried over anhydrous magnesium sulfate, followed by filtration to obtain a crude liquid. The crude liquid was concentrated by an evaporator, followed by distillation under reduced pressure to obtain 177 g of $CF_2$=$CFCF_2C(CF_3)(OCH_2OCH_3)CH_2CH$=$CH_2$ (43 to 45° C./0.6 kPa) The $^1H$ NMR and $^{19}F$ NMR data are shown below.

$^1H$ NMR (399.8 MHz, solvent: $CDCl_3$, standard: tetramethylsilane) $\delta$ (ppm) 3.16 (broad, 2H), 3.44 (s, 3H), 4.95 (m, 2H), 5.22 (m, 2H), 5.92 (m, 1H).

$^{19}F$ NMR (376.2 MHz, solvent: $CDCl_3$, standard: $CFCl_3$) $\delta$ (ppm): −72.5 (m, 3F), −92.9 (m, 1F), −106.8 (m, 1F), −109.7 (m, 2F), −183.0 (m, 1F).

Preparation Example for the Acrylic Monomer (7)

Preparation Example 3

Into a 300 ml eggplant flask, a solution prepared by dissolving 25 g of 1,4-bis(1-hydroxy-1-trifluoromethyl-2,2,2-trifluoroethyl)benzene in 100 ml of methanol and a solution prepared by dissolving 2.44 g of sodium hydroxide in 45 ml of methanol, were added. The mixture was thoroughly stirred by a magnetic stirrer overnight, and then, the solvent was distilled off under reduced pressure. Then, 25 ml of THF was added, and further, a solution prepared by dissolving 5.52 g of acryloyl chloride in 50 ml of THF, was dropwise added. The mixture was stirred at room temperature for a few days, and then 100 ml of water was added. This aqueous layer was extracted with diethyl ether. The organic layer was dried over anhydrous magnesium sulfate and filtered through a filter paper, whereupon the solvent was distilled off. A crude product thereby obtained was purified by column chromatography and recrystallization to obtain 10 g of $CH_2=C(H)CO_2C(CF_3)_2—Ph—C(CF_3)_2—OH$. Here, this reaction was carried out in accordance with the literature of Polym. Prepr. (Am. Chem. Soc., Div. Polym. Chem.) vol. 30, No. 2, 1989, p. 213.

Further, chloromethyl methyl ether was reacted to the acrylic monomer obtained as described above, to convert the hydroxyl group to a methoxymethyloxy group.

Preparation Example for the Acrylic Monomer (8)

Preparation Example 4

In accordance with the literature of J. Photopolym. Sci. Technol., Vol. 14, No. 4, 2001, p. 613, $CH_2=CHCO_2C(CF_3)_2C_6H_{10}C(CF_3)_2OH$ was synthesized. Here, $C_6H_{10}$ represents a 1,4-cyclohexylene group.

Preparation Example 5

In accordance with the literature of J. Photopolym. Sci. Technol., Vol. 14, No. 4, 2001, p. 613, $CH_2=CHCO_2C(CF_3)_2C_6H_{10}C(CF_3)_2OCH_2OCH_3$ was synthesized. Here, $C_6H_{10}$ represents a 1,4-cyclohexylene group.

Preparation Example for the Fluoropolymer (A)

Preparation Example 6

4.5 g of 1,1,2,3,3-pentafluoro-4-trifluoromethyl-4-hydroxy-1,6-heptadiene [$CF_2=CFCF_2C(CF_3)(OH)CH_2CH=CH_2$], 1.72 g of 1,1,2,3,3-pentafluoro-4-trifluoromethyl-4-methoxymethyloxy-1,6-heptadiene [$CF_2=CFCF_2C(CF_3)(OCH_2OCH_3)CH_2CH=CH_2$], 0.166 g of tert-butyl methacrylate, 0.69 g of 1,4-dioxane and 16.58 g of methyl acetate, were charged into a pressure resistant reactor made of glass having an internal capacity of 30 mL. Then, 0.095 g of perfluorobenzoyl peroxide was added as a polymerization initiator. The interior of the system was freeze-deaerated, and then polymerization was carried out for 18 hours in a constant temperature shaking vessel (70° C.). After the polymerization, the reaction solution was dropped into hexane, and the polymer was reprecipitated. Then, vacuum drying was carried out at 150° C. for 15 hours. As a result, 5.4 g of a white powdery non-crystalline polymer (hereinafter referred to as polymer 1A) having fluorinated ring type monomeric units and monomeric units derived from tert-butyl methacrylate, on the main chain, was obtained. The molecular weight of the polymer 1A was measured by GPC (THF solvent), whereby as calculated as polystyrene, the number average molecular weight (Mn) was 10,000, and the weight average molecular weight (Mw) was 31,000, whereby Mw/Mn was 3.10. The glass transition temperature as measured by a differential scanning calorimetry (DSC) was 150° C.

The polymer composition calculated from the $^{19}F$ NMR and $^1H$ NMR measurements was such that monomeric units of 1,1,2,3,3-pentafluoro-4-trifluoromethyl-4-hydroxy-1,6-heptadiene/monomeric units of 1,1,2,3,3-pentafluoro-4-trifluoromethyl-4-methoxymethyloxy-1,6-heptadiene/monomeric units of tert-butyl methacrylate=71.5/23.5/5 mol %.

Preparation Example 7

4.5 g of 1,1,2,3,3-pentafluoro-4-trifluoromethyl-4-hydroxy-1,6-heptadiene [$CF_2=CFCF_2C(CF_3)(OH)CH_2CH=CH_2$], 1.94 g of 1,1,2,3,3-pentafluoro-4-trifluoromethyl-4-methoxymethyloxy-1,6-heptadiene [$CF_2=CFCF_2C(CF_3)(OCH_2OCH_3)CH_2CH=CH_2$], 0.066 g of tert-butyl methacrylate, 0.69 g of 1,4-dioxane and 16.90 g of methyl acetate, were charged into a pressure resistant reactor made of glass having an internal capacity of 30 ml. Then, 0.096 g of perfluorobenzoyl peroxide was added as a polymerization initiator. The interior of the system was freeze-deaerated, and then polymerization was carried out for 18 hours in a constant temperature shaking vessel (70° C.). After the polymerization, the reaction solution was dropped into hexane, and the polymer was reprecipitated. Then, vacuum drying was carried out at 150° C. for 15 hours. As a result, 5.6 g of a white powdery non-crystalline polymer (hereinafter referred to as polymer 2A) having fluorinated ring type monomeric units and monomeric units of tert-butyl methacrylate on the main chain, was obtained. The molecular weight of the polymer 2A was measured by GPC (THF solvent), whereby as calculated as a polystyrene, the number average molecular weight (Mn) was 11,100, and the weight average molecular weight (Mw) was 32,100, whereby Mw/Mn was 2.89. The glass transition point as measured by a differential scanning calorimetry (DSC) was 150° C.

The polymer composition calculated from the $^{19}F$ NMR and $^1H$ NMR measurements was such that monomeric units of 1,1,2,3,3-pentafluoro-4-trifluoromethyl-4-hydroxy-1,6-heptadiene/monomeric units of 1,1,2,3,3-pentafluoro-4-trifluoromethyl-4-methoxymethyloxy-16-heptadiene/monomeric units of tert-butyl methacrylate=71.5/26.5/2 mol %.

Preparation Example 8

5.0 g of 1,1,2,3,3-pentafluoro-4-trifluoromethyl-4-hydroxy-1,6-heptadiene [$CF_2=CFCF_2C(CF_3)(OH)CH_2CH=CH_2$], 0.82 g of 1,1,2,3,3-pentafluoro-4-trifluoromethyl-4-methoxymethyloxy-1,6-heptadiene [$CF_2=CFCF_2C(CF_3)(OCH_2OCH_3)CH_2CH=CH_2$], 0.53 g of tert-butyl methacrylate, 0.78 g of 1,4-dioxane and -16.52 g of methyl acetate, were charged into a pressure resistant reactor made of glass having an internal capacity of 30 mL. Then, 0.188 g of perfluorobenzoyl peroxide was added as a polymerization initiator. The interior of the system was freeze-deaerated, and then polymerization was carried out for 18 hours in a constant temperature shaking vessel (70° C.). After the polymerization, the reaction solution was dropped into hexane, and the polymer was reprecipitated. Then, vacuum drying was carried out at 150° C. for 15 hours. As a result, 5.2 g of a white powdery non-crystalline polymer (hereinafter referred to as polymer 3A) having fluorinated ring type monomeric units and monomeric units made of tert-butyl methacrylate on the main chain, was obtained. The molecular weight of the polymer 3A was measured by GPC (THF solvent), whereby as calculated as a polystyrene, the number average molecular weight (Mn) was 6,700, and the weight average molecular weight (Mw) was 16,600, whereby Mw/Mn was 2.47. The glass transition point as measured by a differential scanning calorimetry, was 154° C.

The polymer composition calculated from the $^{19}$F NMR and $^1$H NMR measurements, was such that monomeric units of 1,1,2,3,3-pentafluoro-4-trifluoromethyl-4-hydroxy-1,6-heptadiene/monomeric units of 1,1,2,3,3-pentafluoro-4-trifluoromethyl-4-methoxymethyloxy-1,6-heptadiene/monomeric units of tert-butyl methacrylate=73/10/17 mol %.

Preparation Example 9

4.3 g of 1,1,2,3,3-pentafluoro-4-trifluoromethyl-4-hydroxy-1,6-heptadiene [$CF_2$=$CFCF_2C(CF_3)(OH)CH_2CH$=$CH_2$], 1.64 g of tert-butyl methacrylate, 0.66 g of 1,4-dioxane and 15.4 g of methyl acetate, were charged into a pressure resistant reactor made of glass having an internal capacity of 30 mL. Then, 0.176 g of perfluorobenzoyl peroxide was added as a polymerization initiator. The interior of the system was freeze-deaerated, and then polymerization was carried out for 18 hours in a constant temperature shaking vessel (70° C.). After the polymerization, the reaction solution was dropped into hexane, and the polymer was reprecipitated. Then, vacuum drying was carried out at 150° C. for 15 hours. As a result, 4.1 g of a white powdery non-crystalline polymer (hereinafter referred to as polymer 4A) having fluorinated ring type monomeric units and monomeric units of tert-butyl methacrylate in the main chain, was obtained. The molecular weight of the polymer 4A was measured by GPC (THF solvent), whereby as calculated as a polystyrene, the number average molecular weight (Mn) was 5,800, and the weight average molecular weight (mw) was 11,800, whereby Mw/Mn was 2.03. The glass transition point as measured by a differential scanning calorimetry (DSC) was 159° C.

The polymer composition calculated from the $^{19}$F NMR and $^1$H NMR measurements, was such that monomeric units of 1,1,2,3,3-pentafluoro-4-trifluoromethyl-4-hydroxy-1,6-heptadiene/monomeric units of tert-butyl methacrylate=50/50 mol %.

Preparation Example 10

3.7 g of 1,1,2,3,3-pentafluoro-4-trifluoromethyl-4-hydroxy-1,6-heptadiene [$CF_2$=$CFCF_2C(CF_3)(OH)CH_2CH$=$CH_2$], 1.95 g of tert-butyl methacrylate, 0.57 g of 1,4-dioxane and 14.7 g of methyl acetate, were charged into a pressure resistant reactor made of glass having an internal capacity of 30 mL. Then, 0.167 g of perfluorobenzoyl peroxide was added as a polymerization initiator. The interior of the system was freeze-deaerated, and then polymerization was carried out for 18 hours in a constant temperature shaking vessel (70° C.). After the polymerization, the reaction solution was dropped into hexane, and the polymer was reprecipitated. Then, vacuum drying was carried out at 150° C. for 15 hours. As a result, 3.1 g of a white powdery non-crystalline polymer (hereinafter referred to as polymer 5A) having fluorinated ring type monomeric units and monomeric units of tert-butyl methacrylate on the main chain, was obtained. The molecular weight of the polymer 5A was measured by GPC (THF solvent), whereby as calculated as a polystyrene, the number average molecular weight (Mn) was 4,800, and the weight average molecular weight (Mw) was 10,200, whereby Mw/Mn was 2.13. The glass transition point as measured by a differential scanning calorimetry (DSC) was 161° C.

The polymer composition calculated from the $^{19}$F NMR and $^1$H NMR measurements, was such that monomeric units of 1,1,2,3,3-pentafluoro-4-trifluoromethyl-4-hydroxy-1,6-heptadiene/monomeric units of tert-butyl methacrylate=40/60 mol %.

Preparation Example 11

5.0 g of 1,1,2,3,3-pentafluoro-4-trifluoromethyl-4-hydroxy-1,6-heptadiene [$CF_2$=$CFCF_2C(CF_3)(OH)CH_2CH$=$CH_2$], 1.45 g of 2-ethyl-2-adamantyl methacrylate, 0.77 g of 1,4-dioxane and 14.99 g of methyl acetate, were charged into a pressure resistant reactor made of glass having an internal capacity of 30 mL. Then, 0.191 g of perfluorobenzoyl peroxide was added as a polymerization initiator. The interior of the system was freeze-deaerated, and then polymerization was carried out for 18 hours in a constant temperature shaking vessel (70° C.). After the polymerization, the reaction solution was dropped into hexane, and the polymer was reprecipitated. Then, vacuum drying was carried out at 150° C. for 15 hours. As a result, 3.0 g of a white powdery non-crystalline polymer (hereinafter referred to as polymer 6A) having fluorinated ring type monomeric units and monomeric units of 2-ethyl-2-adamantyl methacrylate on the main chain, was obtained. The molecular weight of the polymer 6A was measured by GPC (THF solvent), whereby as calculated as a polystyrene, the number average molecular weight (Mn) was 4,000, and the weight average molecular weight (Mw) was 7,600, whereby Mw/Mn was 1.90. The glass transition point measured by a differential scanning calorimetry (DSC) was 183° C.

The polymer composition calculated from the $^{19}$F NMR and $^1$H NMR measurements, was such that monomeric units of 1,1,2,3,3-pentafluoro-4-trifluoromethyl-4-hydroxy-1,6-heptadiene/monomeric units of 2-ethyl-2-adamantyl methacrylate=70/30 mol %.

Preparation Example 12

3.0 g of 1,1,2,3,3-pentafluoro-4-trifluoromethyl-4-hydroxy-1,6-heptadiene [$CF_2$=$CFCF_2C(CF_3)(OH)CH_2CH$=$CH_2$], 1.74 g of 1,1,2,3,3-pentafluoro-4-trifluoromethyl-4-methoxyemthyloxy-1,6-heptadiene [$CF_2$=$CFCF_2C(CF_3)(OCH_2OCH_3)CH_2CH$=$CH_2$], 0.86 g of the monomer synthesized in Preparation Example 3, 0.46 g of 1,4-dioxane and 14.68 g of methyl acetate, were charged into a pressure resistant reactor made of glass having an internal capacity of 30 mL. Then, 0.166 g of perfluorobenzoyl peroxide was added as a polymerization initiator. The interior of the system was freeze-deaerated, and then polymerization was carried out for 18 hours in a constant temperature shaking vessel (70° C.). After the polymerization, the reaction solution was dropped into hexane, and the polymer was reprecipitated. Then, vacuum drying was carried out at 150° C. for 15 hours. As a result, 4.5 g of a white powdery non-crystalline polymer (hereinafter referred to as polymer 7A) having fluorinated ring type monomeric units and monomeric units of the monomer of Preparation Example 3 on the main chain, was obtained. The molecular weight of the polymer 7A was measured by GPC (THF solvent), whereby as calculated as a polystyrene, the number average molecular weight (Mn)

was 9,200, and the weight average molecular weight (Mw) was 26,000, whereby Mw/Mn was 2.83. The glass transition point measured by a differential scanning calorimetry (DSC) was 160° C.

The polymer composition calculated from the $^{19}$F NMR and $^1$H NMR measurements, was such that monomeric units of 1,1,2,3,3-pentafluoro-4-trifluoromethyl-4-hydroxy-1,6-heptadiene/monomeric units of 1,1,2,3,3-pentafluoro-4-trifluoromethyl-4-methoxymethyloxy-1,6-heptadiene/monomeric units of the monomer of Preparation Example 3=60/29/11 mol %.

Preparation Example 13

3.0 g of 1,1,2,3,3-pentafluoro-4-trifluoromethyl-4-hydroxy-1,6-heptadiene [$CF_2$=$CFCF_2C(CF_3)(OH)CH_2CH$=$CH_2$], 1.74 g of 1,1,2,3,3-pentafluoro-4-trifluoromethyl-4-methoxymethyloxy-1,6-heptadiene [$CF_2$=$CFCF_2C(CF_3)(OCH_2OCH_3)CH_2CH$=$CH_2$], 0.87 g of the monomer synthesized in Preparation Example 4, 0.46 of 1,4-dioxane and 14.71 g of methyl acetate, were charged into a pressure resistant reactor made of glass having an internal capacity of 30 mL. Then, 0.166 g of perfluorobenzoyl peroxide was added as a polymerization initiator. The interior of the system was freeze-deaerated, and then polymerization was carried out for 18 hours in a constant temperature shaking vessel (70° C.). After the polymerization, the reaction solution was dropped into hexane, and the polymer was reprecipitated. Then, vacuum drying was carried out at 150° C. for 15 hours. As a result, 4.6 g of a white powdery non-crystalline polymer (hereinafter referred to as polymer 8A) having fluorinated ring type monomeric units and monomeric units of the monomer of Preparation Example 4 on the main chain, was obtained. The molecular weight of the polymer 8A was measured by GPC (THF solvent), whereby as calculated as a polystyrene, the number average molecular weight (Mn) was 9,400, and the weight average molecular weight (Mw) was 25,800, whereby Mw/Mn was 2.74. The glass transition point measured by a differential scanning calorimetry (DSC) was 158° C.

The polymer composition calculated from the $^{19}$F NMR and $^1$H NMR measurements, was such that monomeric units of 1,1,2,3,3-pentafluoro-4-trifluoromethyl-4-hydroxy-1,6-heptadiene/monomeric units of 1,1,2,3,3-pentafluoro-4-trifluoromethy-4-methoxymethyloxy-1,6-heptadiene/monomeric units of the monomer of Preparation Example 4=60/28/12 mol %.

Preparation Example 14

3.5 g of 1,1,2,3,3-pentafluoro-4-trifluoromethyl-4-hydroxy-1,6-heptadiene [$CF_2$=$CFCF_2C(CF_3)(OH)CH_2CH$=$CH_2$], 2.10 g of the monomer synthesized in Preparation Example 5, 0.54 of 1,4-dioxane and 14.60 g of methyl acetate, were charged into a pressure resistant reactor made of glass having an internal capacity of 30 mL. Then, 0.166 g of perfluorobenzoyl peroxide was added as a polymerization initiator. The interior of the system was freeze-deaerated, and then polymerization was carried out for 18 hours in a constant temperature shaking vessel (70° C.). After the polymerization, the reaction solution was dropped into hexane, and the polymer was reprecipitated. Then, vacuum drying was carried out at 150° C. for 15 hours. As a result, 4.2 g of a white powdery non-crystalline polymer (hereinafter referred to as polymer 9A) having fluorinated ring type monomeric units and monomeric units of the monomer of Preparation Example 5 on the main chain, was obtained. The molecular weight of the polymer 9A was measured by GPC (THF solvent), whereby as calculated as a polystyrene, the number average molecular weight (Mn) was 7,400, and the weight average molecular weight (Mw) was 19,800, whereby Mw/Mn was 2.68. The glass transition point measured by a differential scanning calorimetry (DSC) was 167° C.

The polymer composition calculated from the $^{19}$F NMR and $^1$H NMR measurements, was such that monomeric units of 1,1,2,3,3-pentafluoro-4-trifluoromethyl-4-hydroxy-1,6-heptadiene/monomeric units of the monomer of Preparation Example 5=69/31 mol %.

Preparation Example 15

5 g of 1,1,2,3,3-pentafluoro-4-trifluoromethyl-4-hydroxy-1,6-heptadiene [$CF_2$=$CFCF_2C(CF_3)(OH)CH_2CH$=$CH_2$], 5.7 g of 1,1,2,3,3-pentfluoro-4-trifluoromethyl-4-methoxymethyloxy-1,6-heptadiene [$CF_2$=$CFCF_2C(CF_3)(OCH_2OCH_3)CH_2CH$=$CH_2$] and 23 g of methyl acetate, were charged into a pressure resistant reactor made of glass having an internal capacity of 50 cc. Then, 0.24 g of perfluorobenzoyl peroxide was added as a polymerization initiator. The interior of the system was freeze-deaerated, and then polymerization was carried out for 6 hours in a constant temperature shaking vessel (70° C.). After the polymerization, the reaction solution was dropped into hexane, and the polymer was reprecipitated. Then, vacuum drying was carried out at 150° C. for 12 hours. As a result, 8.5 g of a non-crystalline polymer (hereinafter referred to as polymer 10A) having fluorinated ring structured on the main chain, was obtained. The molecular weight of the polymer 10A was measured by GPC (THF solvent), whereby as calculated as a polystyrene, the number average molecular weight (Mn) was 12,000, and the weight average molecular weight (Mw) was 34,800, whereby Mw/Mn was 2.90. The glass transition point measured by a differential scanning calorimetry (DSC) was 129° C.

The polymer composition calculated from the $^{19}$F NMR and $^1$H NMR measurements, was such that monomeric units of 1,1,2,3,3-pentafluoro-4-trifluoromethyl-4-hydroxy-1,6-heptadiene/monomeric units of 1,1,2,3,3-pentafluoro-4-trifluoromethyl-4-methoxymethyloxy-1,6-heptadiene= 52/48 mol %.

Examples 1 to 9

1 g of one of the polymers 1A to 9A prepared in Preparation Examples 6 to 14 and 0.05 g of trimethylsulfonium triflate were dissolved in 10 g of propylene glycol monomethyl ether acetate, followed by filtration by means of a PTFE filter having a pore diameter of 0.2 μm to obtain a resist composition.

The above resist composition was spin-coated on a silicon substrate treated with hexamethyldisilazane, followed by heat treatment at 80° C. for 2 minutes to form a resist film having a thickness of 0.3 μm. In an exposure test apparatus flushed with nitrogen, the substrate having the above resist film formed, was placed, and a mask having a pattern drawn by chromium on a quartz plate, was put thereon in close contact therewith. ArF laser beams were irradiated through the mask, whereupon, after exposure at 100° C. for 2 minutes, baking was carried out. The development was carried out at 23° C. for 3 minutes with a tetramethylammonium hydroxide aqueous solution (2.38 mass %), followed by washing with pure water for 1 minute. The light transmittance of the resist film, the development test results and the etching resistance are shown in Table 1.

Comparative Example 1

An operation was carried out in the same manner as in Examples 1 to 9 except that the polymer 10A was used instead of the polymers of Examples 1 to 9. The light transmittance of the resist film, the development test results and the etching resistance are shown in Table 1.

TABLE 1

| | Polymer | Light transmittance (193 nm) (%) | Light transmittance (157 nm) (%) | Exposure (mJ/cm$^2$) | Development speed (nm/sec) | Line and space width (L/S = 1/1) ($\mu$m) | Etching resistance |
|---|---|---|---|---|---|---|---|
| Example 1 | 1A | 85 | 53 | 18 | 120 | 0.15 | ⊚ |
| Example 2 | 2A | 85 | 56 | 30 | 60 | 0.19 | ⊚ |
| Example 3 | 3A | 83 | 48 | 15 | 300 | 0.13 | ⊚ |
| Example 4 | 4A | 84 | 35 | 12 | 850 | 0.13 | ○ |
| Example 5 | 5A | 80 | 20 | 27 | 1000 | 0.20 | ○ |
| Example 6 | 6A | 73 | 45 | 15 | 550 | 0.15 | ⊚ |
| Example 7 | 7A | 67 | 35 | 20 | 210 | 0.16 | ⊚ |
| Example 8 | 8A | 80 | 48 | 19 | 200 | 0.16 | ⊚ |
| Example 9 | 9A | 75 | 45 | 17 | 330 | 0.17 | ⊚ |
| Comparative Example 1 | 10A | 80 | 51 | 18 | 40 | 0.30 | ○ |

Etching resistance: The etching rate was measured by an argon/octafluorocyclobutane/oxygen mixed gas plasma, whereby when a novolak resin is rated to be 1, one with a rate of 1.0 or less is represented by ⊚, one with a rate of more than 1.0 and less than 1.2 is represented by ○, and one with a rate of at least 1.2 is represented by X.

The resist composition of the present invention is useful as a chemical amplification type resist, and it is particularly excellent in transparency to far ultraviolet rays such as KrF or ArF excimer laser or vacuum ultraviolet rays such as F$_2$ excimer laser, and in the dry etching property and further is capable of readily forming a resist pattern excellent in sensitivity, resolution, evenness, heat resistance, etc.

The entire disclosure of Japanese Patent Application No. 2002-057342 filed on Mar. 4, 2002 including specification, claims and summary is incorporated herein by reference in its entirety.

What is claimed is:

1. A resist composition comprising a fluoropolymer (A), an acid-generating compound (B) which generates an acid under irradiation with light and an organic solvent (C), wherein the fluoropolymer (A) comprises:

(i) blocked acidic groups, (ii) monomeric units formed by cyclopolymerization of a fluorinated diene of formula (1)

$$CF_2=CR^1-Q-CR^2=CH_2 \quad (1)$$

wherein each of R$^1$ and R$^2$ which are independent of each other, is a hydrogen atom, a fluorine atom, a methyl group or a trifluoromethyl group, and Q is a bivalent organic group which is a blocked acidic group capable of forming an acidic group by an acid, an acidic group, or a group other than an acidic group which can be converted to a blocked acidic group; and (iii) monomeric units formed by polymerization of an acrylic monomer of formula (2):

$$CH_2=CR^3-CO_2R^4 \quad (2)$$

wherein R$^3$ is a hydrogen atom, a fluorine atom, a methyl group or a trifluoromethyl group, and R$^4$ is a hydrogen atom, a hydrocarbon group, an organic group having an acidic group, an organic group having a blocked acidic group capable of forming an acidic group by an acid, or an organic group having a group other than an acidic group which can be converted to a blocked acidic group.

2. The resist composition according to claim 1, wherein the fluoropolymer (A) further comprises acidic groups.

3. The resist composition according to claim 1, wherein the acidic groups comprise acidic hydroxyl groups, and the blocked acidic groups comprise blocked acidic hydroxyl groups.

4. The resist composition according to claim 2, wherein the acidic groups comprise acidic hydroxyl groups, and the blocked acidic groups comprise blocked acidic hydroxyl groups.

5. The resist composition according to claim 1, wherein the fluoropolymer (A) has a molar ratio of the monomeric units formed by cyclopolymerization of a fluorinated diene of formula (1) to the monomeric units formed by polymerization of an acrylic monomer of formula (2) ranging from 95:5 to 50:50.

6. The resist composition according to claim 1, wherein the acrylic monomer of the formula (2) in the fluoropolymer (A) comprises a monomer of formula (6), (7) or (8):

$$CH_2=CR^3CO_2R^9 \quad (6)$$

$$CH_2=CR^3CO_2C(CF_3)_2-Ph-C(CF_3)_2-OX^3 \quad (7)$$

$$CH_2=CR^3CO_2C(CF_3)_2-R^y-C(CF_3)_2-OX^3 \quad (8)$$

wherein R$^3$ is a hydrogen atom, a fluorine atom, a methyl group or a trifluoromethyl group, R$^9$ is a hydrogen atom, a tert-butyl group, a 1-alkyl-1-cyclohexyl group or a 2-alkyl-2-adamantyl group, X$^3$ is a hydrogen atom, a tert-butyl group, —CH$_2$OCH$_3$, —CO$_2$(tert-C$_4$H$_9$), —CH(CH$_3$)OC$_2$H$_5$ or a 2-tetrahydropyranyl group, Ph is a phenylene group, and R$^y$ is a cyclohexylene group.

7. A resist composition comprising a fluoropolymer (A), an acid-generating compound (B) which generates an acid under irradiation with light and an organic solvent (C), wherein the fluoropolymer (A) comprises (i) blocked acidic groups, (ii) monomeric units formed by cyclopolymerization of a fluorinated diene of formula (9):

$$CF_2=CR^1-R^5-C(R^7)(R^8)-R^6-CR^2=CH_2 \quad (9)$$

wherein each of R$^1$ and R$^2$ which are independent of each other, is a hydrogen atom, a fluorine atom, a methyl group or a trifluoromethyl group, each of R$^5$ and $R^6$ which are independent of each other, is a single bond, an oxygen atom, an alkylene group having at most three carbon atoms which may have an etheric oxygen atom, or a fluoroalkylene group having at most 3 carbon atoms which may have an etheric oxygen atom, $R^7$ is a hydrogen atom, a fluorine atom, an alkyl group having at most 3 carbon atoms, or a fluoroalkyl group having at most 3 carbon atoms, and $R^8$ is a blocked acidic group, an acidic group, or a monovalent organic group having a blocked acidic group or an acidic group; and (iii) monomeric units formed by polymerization of an acrylic monomer of formula (2):

$$CH_2=CR^3-CO_2R^4 \qquad (2)$$

wherein $R^3$ is a hydrogen atom, a fluorine atom, a methyl group or a trifluoromethyl group, and $R^4$ is a hydrogen atom, a hydrocarbon group, an organic group having an acidic group, an organic group having a blocked acidic group capable of forming an acidic group by an acid, or an organic group other than an acidic group having a group which can be converted to a blocked acidic group.

8. The resist composition according to claim 7, wherein the fluoropolymer (A) further comprises acidic groups.

9. The resist composition according to claim 7, wherein the acidic groups comprise acidic hydroxyl groups, and the blocked acidic groups comprise blocked acidic hydroxyl groups.

10. The resist composition according to claim 8, wherein the acidic groups comprise acidic hydroxyl groups, and the blocked acidic groups comprise blocked acidic hydroxyl groups.

11. The resist composition according to claim 7, wherein the fluoropolymer (A) has a molar ratio of the monomeric units formed by cyclopolymerization of a fluorinated diene of the formula (9) to the monomeric units formed by polymerization of an acrylic monomer of the formula (2) ranging from 95:5 to 50:50.

12. The resist composition according to claim 7, wherein the acrylic monomer of formula (2) in fluoropolymer (A) comprises a monomer of formula (6), (7) or (8):

$$CH_2=CR^3CO_2R^9 \qquad (6)$$
$$CH_2=CR^3CO_2C(CF_3)_2-Ph-C(CF_3)_2-OX^3 \qquad (7)$$
$$CH_2=CR^3CO_2C(CF_3)_2-R^y-C(CF_3)_2-OX^3 \qquad (8)$$

wherein $R^3$ is a hydrogen atom, a fluorine atom, a methyl group or a trifluoromethyl group, $R^9$ is a hydrogen atom, a tert-butyl group, a 1-alkyl-1-cyclohexyl group or a 2-alkyl-2-adamantyl group, $X^3$ is a hydrogen atom, a tert-butyl group, $-CH_2OCH_3$, $-CO_2(tert-C_4H_9)$, $-CH(CH_3)OC_2H_5$ or a 2-tetrahydropyranyl group, Ph is a phenylene group, and $R^y$ is a cyclohexylene group.

13. A resist composition comprising a fluoropolymer (A), an acid-generating compound (B) which generates an acid under irradiation with light and an organic solvent (C), wherein the fluoropolymer (A) comprises
 (i) blocked acidic groups, (ii) monomeric units formed by cyclopolymerization of a fluorinated diene of formula (4) or (5):

$$CF_2=CFCF_2CX^2(CF_3)CH_2CH=CH_2 \qquad (4)$$
$$CF_2=CFCF_2CH(-(CH_2)_pC(CF_3)_2X^2)CH_2CH=CH_2 \qquad (5)$$

wherein $X^2$ is a hydroxyl group, $O(tert-C_4H_9)$, $OCH_2OCH_3$, $OCO_2(tert-C_4H_9)$, $OCH(CH_3)OC_2H_5$ or a 2-tetrahydropyranyloxy group, and p is an integer of from 1 to 3; and (iii) monomeric units formed by polymerization of an acrylic monomer of formula (2):

$$CH_2=CR^3-CO_2R^4 \qquad (2)$$

wherein $R^3$ is a hydrogen atom, a fluorine atom, a methyl group or a trifluoromethyl group, and $R^4$ is a hydrogen atom, a hydrocarbon group, an organic group having an acidic group, an organic group having a blocked acidic group capable of forming an acidic group by an acid, or an organic group having a group other than an acidic group which can be converted to a blocked acidic group.

14. The resist composition according to claim 13, wherein the fluoropolymer (A) further comprises acidic groups.

15. The resist composition according to claim 13, wherein the acidic groups comprise acidic hydroxyl groups, and the blocked acidic groups comprise blocked acidic hydroxyl groups.

16. The resist composition according to claim 14, wherein the acidic groups comprise acidic hydroxyl groups, and the blocked acidic groups comprise blocked acidic hydroxyl groups.

17. The resist composition according to claim 13, wherein the fluoropolymer (A) has a molar ratio of the monomeric units formed by cyclopolymerization of a fluorinated diene of the formula (4) or (5) to the monomeric units formed by polymerization of an acrylic monomer of the formula (2) ranging from 95:5 to 50:50.

18. The resist composition according to claim 13, wherein the acrylic monomer of the formula (2) in the fluoropolymer (A) comprises a monomer of formula (6), (7) or (8):

$$CH_2=CR^3CO_2R^9 \qquad (6)$$
$$CH_2=CR^3CO_2C(CF_3)_2-Ph-C(CF_3)_2-OX^3 \qquad (7)$$
$$CH_2=CR^3CO_2C(CF_3)_2-R^y-C(CF_3)_2-OX^3 \qquad (8)$$

wherein $R^3$ is a hydrogen atom, a fluorine atom, a methyl group or a trifluoromethyl group, $R^9$ is a hydrogen atom, a tert-butyl group, a 1-alkyl-1-cyclohexyl group or a 2-alkyl-2-adamantyl group, $X^3$ is a hydrogen atom, a tert-butyl group, $-CH_2OCH_3$, $-CO_2(tert-C_4H_9)$, $-CH(CH_3)OC_2H_5$ or a 2-tetrahydropyranyl group, Ph is a phenylene group, and $R^y$ is a cyclohexylene group.

19. The resist composition according to claim 1, wherein the flouropolymer (A) comprises groups which can be converted to blocked acidic groups.

20. The resist composition according to claim 7, wherein the flouropolymer (A) comprises groups which can be converted to blocked acidic groups.

21. The resist composition according to claim 13, wherein the flouropolymer (A) comprises groups which can be converted to blocked acidic groups.

22. A method for preparing a resist composition of claim 1 which comprises, mixing fluoropolymer (A) and acid generating compound (B) in an organic solvent (C).

23. A method for preparing a resist composition of claim 7 which comprises, mixing fluoropolymer (A) and acid generating compound (B) in an organic solvent (C).

24. A method for preparing a resist composition of claim 13 which comprises, mixing fluoropolymer (A) and acid generating compound (B) in an organic solvent (C).

25. A method for preparing a resist film comprising:
 (i) mixing a fluoropolymer (A) and an acid generating compound (B) in an organic solvent (C) to form the resist composition of claim 1;
 (ii) coating the resist composition of claim 1 on a silicon substrate to form a film; and
 (iii) drying the film.

26. The method of claim 25, further comprising irradiating the film with light.

27. A method for preparing a resist film comprising:
(i) mixing an fluoropolymer (A) and an acid generating compound (B) in an organic solvent (C) to form the resist composition of claim 7;
(ii) coating the resist composition of claim 7 on a silicon substrate to form a film; and
(iii) drying the film.

28. The method of claim 27, further comprising irradiating the film with light.

29. A method for preparing a resist film comprising:
(i) mixing a fluoropolymer (A) and an acid generating compound (B) in an organic solvent (C) to form the resist composition of claim 13;
(ii) coating the resist composition of claim 13 on a silicon substrate to form a film; and
(iii) drying the film.

30. The method of claim 29, further comprising irradiating the film with light.

* * * * *